United States Patent
Konecni et al.

[11] Patent Number: 5,981,382
[45] Date of Patent: Nov. 9, 1999

[54] PVD DEPOSITION PROCESS FOR CVD ALUMINUM LINER PROCESSING

[75] Inventors: Anthony J. Konecni, Plano; Noel Russell, Dallas, both of Tex.

[73] Assignee: Texas Instruments Incorporated, Dallas, Tex.

[21] Appl. No.: 09/042,199

[22] Filed: Mar. 13, 1998

[51] Int. Cl.$^6$ ..................... H01L 21/28
[52] U.S. Cl. ............ 438/646; 438/648; 438/653; 438/680; 438/688
[58] Field of Search ................... 438/627, 628, 438/632, 643, 644, 646, 648, 653, 654, 656, 680, 688

[56] References Cited

U.S. PATENT DOCUMENTS

| | | | |
|---|---|---|---|
| 5,108,951 | 4/1992 | Chen et al. | 438/688 |
| 5,371,042 | 12/1994 | Ong | 438/627 |
| 5,523,259 | 6/1996 | Merchant et al. | 438/648 |
| 5,633,199 | 5/1997 | Fiordalice et al. | 438/642 |
| 5,658,828 | 8/1997 | Lin et al. | 438/643 |
| 5,804,501 | 9/1998 | Kim | 438/627 |
| 5,843,837 | 12/1998 | Baek et al. | 438/627 |
| 5,877,087 | 3/1999 | Mosley et al. | 438/656 |

Primary Examiner—T. N. Quach
Attorney, Agent, or Firm—Mark A. Valetti; Carlton H. Hoel; Richard L. Donaldson

[57] ABSTRACT

An embodiment of the instant invention is a method of fabricating a conductive structure for electrically connecting one portion of a semiconductor device to another portion of the device, the method comprising the steps of: providing a continuous liner layer (step 104) of the semiconductor substrate, the liner layer comprised of CVD Al; forming a first conductor (step 106) on the liner layer, the first conductor formed using a source whose output power is in the range of 1 to 5 kW; and forming a second conductor (step 108) on the first conductor, the second conductor formed using a source whose output power is in the range of 10 to 20 kW. Preferably, the conductive structure is selected from the group consisting of: contact, via, and trench. In an alternative embodiment, a nucleation layer is formed (step 104) beneath the continuous liner layer. The nucleation layer is, preferably, comprised of titanium or a Ti/TiN stack. Preferably, the step of forming a first conductor on the liner layer is comprised of depositing an aluminum containing layer using physical vapor deposition. In addition, the step of forming a second conductor on the first conductor is, preferably, comprised of depositing an aluminum containing layer using physical vapor deposition.

21 Claims, 3 Drawing Sheets

PVD DEPOSITION PROCESS FOR CVD ALUMINUM LINER PROCESSING

This is a Non Provisional application filed under 35 USC 119(e) and claims priority of prior provisional, Ser. No. 60/045,404 of inventor Konecni, et al., filed May 1, 1997.

CROSS-REFERENCE TO RELATED PATENT/PATENT APPLICATIONS

The following commonly assigned patent/patent applications are hereby incorporated herein by reference:
  Application Ser. No. 08/447,490, filing date May 23, 1995, abandoned, TI Case No. TI-20792
  Application Ser. No. 08/354,590, filing date Dec. 12, 1994, abandoned TI Case No. TI-20162

FIELD OF THE INVENTION

The instant invention pertains to semiconductor device fabrication and processing and more specifically to a method of fabricating a CVD aluminum structure.

BACKGROUND OF THE INVENTION

In present logic and dynamic random access memory devices, there are several levels of metalization so as to propagate the desired signals from one portion of the device to another. With the increased levels of metalization, the decrease in size of these devices, and the need for higher performance, several problems have arisen. The resistance and capacitance of the levels of metalization and their interconnects lie at the heart of most of these problems. Hence, there is a need to reduce the resistance of these structures and the capacitance between these structures.

In addition, cost, yield, and thermal budget are becoming increasingly important constraints for metalization technology. For via and contact level metallization, aluminum plugs have recently received considerable attention, because of their superior performance and low cost relative to tungsten plugs, which were commonly used in prior generations of devices. These performance benefits include: lower resistance, improved electromigration reliability, and extendibility to smaller feature sizes. A substantial reduction in cost of ownership for the back-end-of-line process is enabled by aluminum plug technology via the ability to deposit the plug and interconnect simultaneously, without the numerous processing steps required for tungsten plugs. By avoiding the need to etchback tungsten or perform chemical-mechanical polishing (CMP) on tungsten, aluminum plug processing eliminates several costly equipment steps and can dramatically reduce yield loss by reducing the number of processing steps.

Aluminum plugs have been formed using high temperature reflow processing. See Z. Xu et. al, *PROCEEDINGS OF VMIC*, 158 (1994). In addition, aluminum plugs have been formed using high pressure reflow processing. See G. A. Dixit et. al., *IEDM TECHNICAL DIGEST*, 105 (1994). High temperature reflow includes deposition of a wetting layer and a two step cold/hot physical vapor deposition (PVD) aluminum deposition. This technique requires high temperatures, is sensitive to outgassing and surface conditions, and is prone to barrier failure at these excessive temperatures. High temperature reflow also fails for vias smaller than 0.35 microns without sloped sidewalls, and the temperatures required for this process are greater than most low dielectric constant materials are able to withstand.

By extruding aluminum into the contact/via at high pressure and a wafer temperature of around 400 C, high pressure aluminum plug fill has overcome most of the problems associated with hot reflow. Unlike high temperature reflow, high pressure reflow works better with steep sidewalls and small dimensions, provided a continuous TiN wetting layer is deposited in the via. See W. Y. Hsu et. al., *ADVANCED METALIZATION FOR ULSI*, 265 (1995). However, this method of fabrication suffers from the following disadvantages: complicated processing equipment for the high pressure regime, questionable reliability of high-pressure equipment, and sensitivity to wafer outgassing.

CVD of aluminum films has also been demonstrated for plug-fill, but several problems have previously limits its use. These problems include: rough morphology, lack of strong <111> texture, no means of copper doping of the aluminum film, risk of voids in the aluminum film, and high precursor cost Roughness, as measured by decreased reflectivity, of a film increases dramatically with increasing thickness. This roughening effect can be reduced by the choice of different nucleation layers, but aluminum films often grow on these layers with randomly oriented texture or form intermetallic phases that are deleterious to interconnect performance (such as $TiAl_3$) during subsequent thermal processing. The most serious problem using blanket CVD aluminum films for plug fill is the risk of void formation during the deposition process. Seams formed during CVD aluminum plug-fill will form a spherical void during later processing and will not, generally, anneal out because of trapped gas from the CVD process. The presence of such defects results in a high risk for open circuits and electromigration failure. Copper incorporation in the CVD Al film, needed to improve electromigration lifetime, has not been practical using codeposition due to the chemical incompatibility of commercially available Al and Cu precursors. Fortunately, PVD deposition of Al—Cu onto CVD Al has been demonstrated to be an effective method for doping CVD Al with Cu, because the rapid diffusion of Cu in Al at modestly elevated temperatures (i.e. greater than 300 C) provides for uniform distribution of Cu.

SUMMARY OF THE INVENTION

In general, the present invention relates to a CVD/PVD hybrid process. The method of one embodiment of the instant invention includes the steps of depositing a thin layer of CVD Al followed by PVD Al—Cu deposition and in situ reflow at wafer temperatures around or below approximately 400 C. The highly conformal CVD Al liner enables reflow at substantially low temperatures than needed for the cold/hot reflow process and reduces the cost of adding CVD Al to the process sequence by utilizing very thin (preferably around or less than 70 nm) CVD Al films, which require only a small amount of precursor per wafer to deposit. Since the vias are still open following CVD liner deposition, possible voids formed by subsequent closure during low-pressure PVD deposition do not trap significant quantities of gas and are readily annealed away.

Use of the low and high power PVD deposition process of the instant invention advantageously provides a rapid fill process while providing highly reflective films which are patternable using I-line and/or deep ultraviolet (DUV) lithography.

An embodiment of the instant invention is a method of fabricating a conductive structure for electrically connecting one portion of a semiconductor device to another portion of the device, the method comprising the steps of: providing a continuous liner layer of the semiconductor substrate, the liner layer comprised of CVD Al; forming a first conductor on the liner layer, the first conductor formed using a source whose output power is in the range of 1 to 5 kW; and forming a second conductor on the first conductor, the second conductor formed using a source whose output power is in the range of 10 to 20 kW. Preferably, the conductive structure is selected from the group consisting of: contact, via, and trench. In an alternative embodiment, a nucleation layer is formed beneath the continuous liner layer. The nucleation layer is, preferably, comprised of titanium or a Ti/TiN stack. Preferably, the step of forming a first conductor on the liner layer is comprised of depositing an aluminum containing layer using physical vapor deposition. In addition, the step of forming a second conductor on the first conductor is, preferably, comprised of depositing an aluminum containing layer using physical vapor deposition.

Another embodiment of the instant invention is a method of fabricating an electrical device having an interconnect over a semiconductor substrate, the method comprising the steps of: providing a dielectric layer, the dielectric layer having a opening with sidewalls and a bottom; forming a liner on the sidewalls and bottom of the opening in the dielectric layer, the liner comprised of CVD Al; forming a first conductive layer on the liner, the first conductor formed using low power deposition; and forming a second conductive layer on the first conductive layer, the second conductive layer formed using higher power deposition. Preferably, the electrical device is selected from the group consisting of: a DRAM device, a logic device, a digital signal processor, a microprocessor, or any combination thereof. The dielectric layer is, preferably, comprised of a material selected from the group consisting of: an aerogel, a zerogel, parylene, BPSG, PSG, HSG, an oxide, a nitride, or any combination thereof. In an alternative embodiment, a nucleation layer is formed beneath the liner. The nucleation layer is, preferably, a continuous metallic-containing material (preferably a Ti/TiN stack). Preferably, the step of forming a first conductive layer is comprised of depositing an aluminum-containing material on the liner using physical vapor deposition, where the power source of the PVD tool is around 1 to 5 kWatt. The aluminum-containing material is, preferably, comprised of a material selected from the group consisting of: copper doped aluminum, Al—Ge—Cu, Al—Si—Cu. Preferably, the step of forming the second conductive layer is comprised of depositing an aluminum-containing material on the first conductive layer using physical vapor deposition, using a power source of around 10 to 20 kWatt. The aluminum-containing material is, preferably, comprised of a material selected from the group consisting of: copper doped aluminum, Al—Ge—Cu, Al—Si—Cu.

BRIEF DESCRIPTION OF THE DRAWINGS

FIGS. 2a–2d illustrate the process flow of the method depicted in FIG. 1.

DETAILED DESCRIPTION OF THE DRAWINGS

Figure 1:
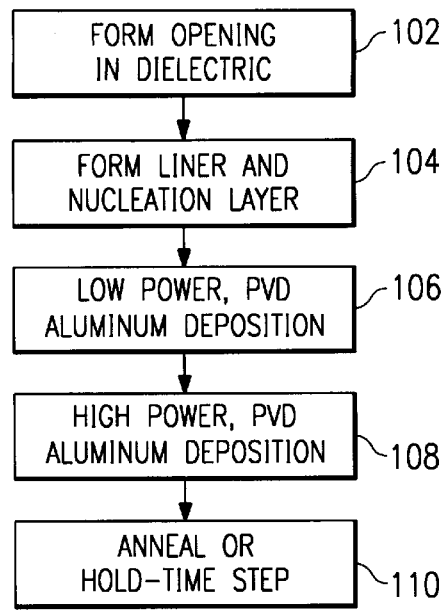
FIG. 1 is a flow diagram of the method of one embodiment of the instant invention.

The process steps and structures described below do not form a complete process flow or device structure. The present invention can be practiced in conjunction with integrated circuit fabrication techniques that are currently used in the art, and only so much of the commonly practiced process steps are included herein as are necessary to provide an understanding of the present invention. The figures that are included with this specification and which represent cross-sections of portions of an integrated circuit during fabrication are not drawn to scale, but instead are included herewith to illustrate the relevant features of the invention.

The method of the instant invention is illustrated in FIGS. 1 and 2a–2d. In step 102, dielectric material 202 is provided over layer 200. Preferably, dielectric material 202 is comprised of an oxide, BPSG, PSG, HSG, or a low dielectric material such as parylene, aerogel, or zerogel. In addition, layer 200 is preferably either a silicon-containing substrate (in the instance where a contact is formed) or another metal structure (in the case where an interconnect/via is formed). Hence, the conductive structure formed using the instant invention may terminate on the substrate or on another conductive structure. It is preferably, that the conductive structure formed using the instant invention terminate on another conductive structure so as to avoid aluminum or copper (if the structure is comprised of aluminum as well as copper) contamination of the underlying silicon substrate in the case of the formation of a contact. Next, opening 204 is formed in dielectric layer 202. Preferably, this is accomplished using phase shifted I-line lithography to provide a pattern for the etching of opening 204. Plasma etching or any other method of selectively removing portions of a dielectric layer is preferably used to form opening 204.

In step 104, nucleation layer 206 is formed on the upper surface of dielectric layer 202 and on the sidewalls and bottom of opening 204. Nucleation layers for CVD Al are important for ensuring void-free fill, acceptable morphology, reflectivity and texture. Smooth morphology is critical for subsequent patterning steps of the metal stack. Hence, nucleation layer 206 must be of good quality. Therefore, nucleation layer 206 is preferably deposited (at preferably less than or around 350 C) using standard CVD processing, high density plasma sputtering, collimated cold sputtering, or other suitable low temperature processing and is preferably comprised of Ti, TiN, a Ti/TiN stack, or a Ti/Al alloy. Nucleation layer 206 preferably covers the sidewalls and bottom of the opening, because CVD Al needs this metallic surface to effectively grow on. In addition, if nucleation layer 206 contains TiN or any other type of barrier material, it will act as a barrier so as to avoid contamination of underlying layer 200 and dielectric layer 202 by the materials used for form the contact/via/interconnect of the instant invention.

Figure 2A:
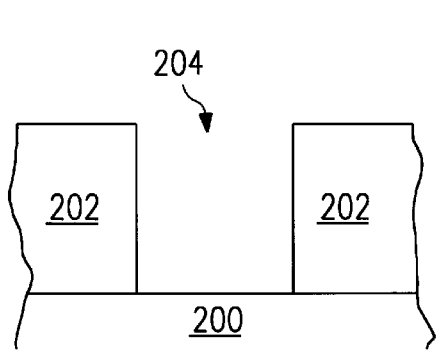
FIGS. 2a–2d are cross-sectional views of a generic semiconductor device.
Figure 2B:
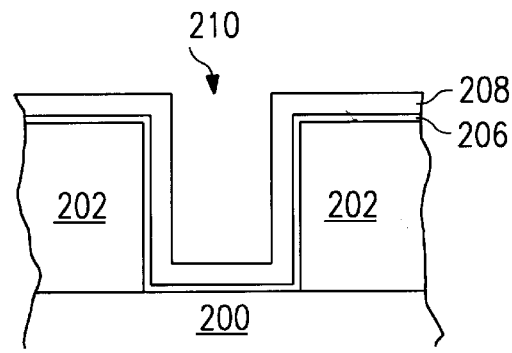

Still referring to step 104 and FIG. 2b, wetting layer 208 is formed on top of nucleation layer 206. Preferably, wetting layer 208 is deposited (at preferably less than or around 350 C) using standard CVD processing, but it can also be formed using high density plasma sputtering, collimated cold sputtering, or other suitable low temperature processing. Wetting layer 208 is preferably on the order of 50 to 100 nm thick and is comprised of Al, Al—Cu (approximately 0.5 to 4%), Al—Ge(approximately 0.5 to 5%)-Cu(approximately 0 to 4%), Al—Si(around 1%)—Cu, or any other aluminum containing alloy.

Figure 2C:
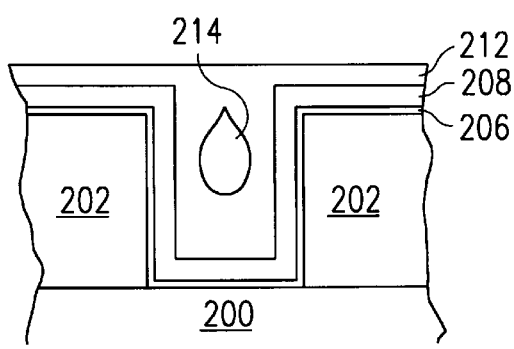

Referring to step 106 and FIG. 2c, conductor 212 is formed on wetting layer 208. Preferably, conductor 212 is deposited until substantially all of the contact/via/interconnect if filled (or at least most of the contact/vias/interconnects on an entire device). Most likely, this will require on the order of 50 to 300 nm of conductor 212 to be deposited. Conductor 212 is preferably comprised of Al, AlCu, Al—Ge—Cu, Al—Si—Cu, or any other aluminum-containing alloy. Preferably, conductor 212 is formed using low power (preferably around 1–5 kWatts—more preferably around 2 kWatts) deposition step (preferably a low power PVD processing technique) at a wafer temperature at or less than 400 C. Using this type of processing, the probability of filling the contact/via/interconnect is higher as compared to standard processing techniques. However, since low power is used to deposit conductor 212, conductor 212 is rougher than films formed using higher powers.

Figure 2D:
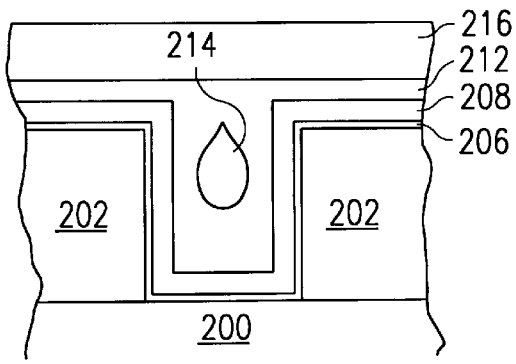

Referring to step 108 and FIG. 2d, conductor 216 is formed on conductor 212. Preferably, conductor 216 is on the order of 200 to 2000 nm thick and it is comprised of the same material as conductor 212 or is comprised of Al, Al—Cu, Al—Ge—Cu, Al—Si—Cu, or any other aluminum-containing alloy. Conductor 216 is preferably deposited using a high power (preferably around 10 to 20 kWatts—more preferably around 15 to 16 kWatts) deposition step (preferably a high power PVD processing technique) at a wafer temperature at or less than 400 C. Using this type of processing results in a smoother film, and, hence, the reflectivity of the entire metal structure will be much higher.

Some of the contact/vias/interconnects may have voids using this method of the instant invention. This void is illustrated in FIGS. 2c and 2d as region 214. However, using this method of the instant invention this should be less of a problem than with standard processing techniques. In addition, using the method of the instant invention, an anneal or hold step 110 may be performed so as to reduce (or eliminate) the voids formed in some of the contact/via/interconnects. Preferably, step 110 is performed by an in situ hold step immediately following the PVD deposition.

Figure 3A:
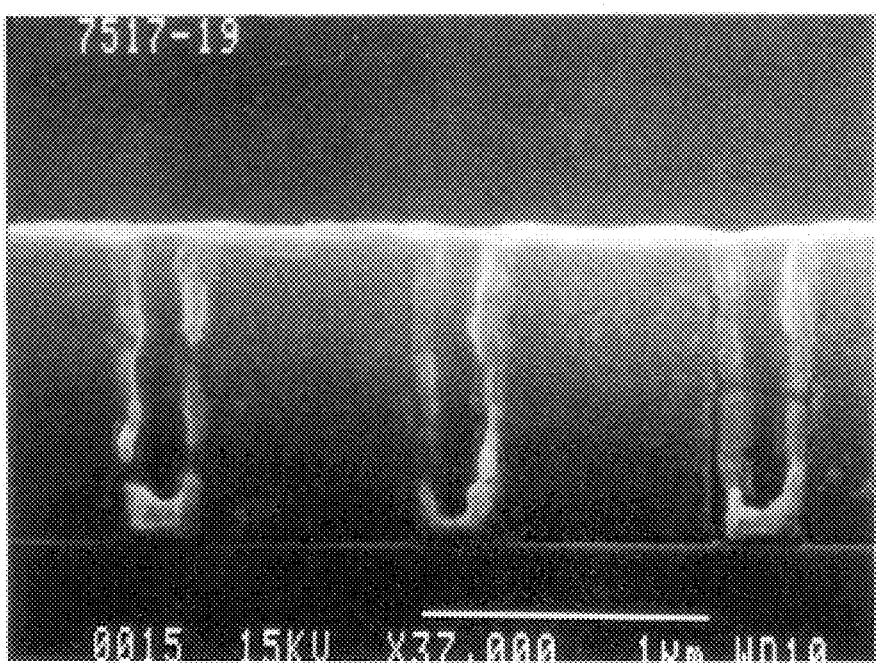
FIGS. 3a–3c are SEM images of a cross-section of a device fabricated using the method of the instant invention.
Figure 3B:
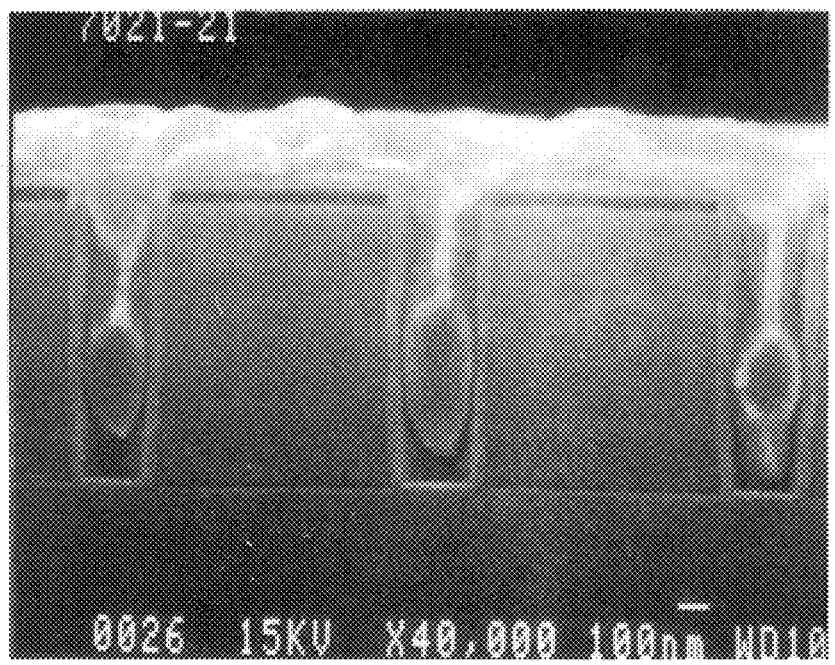
Figure 3C:
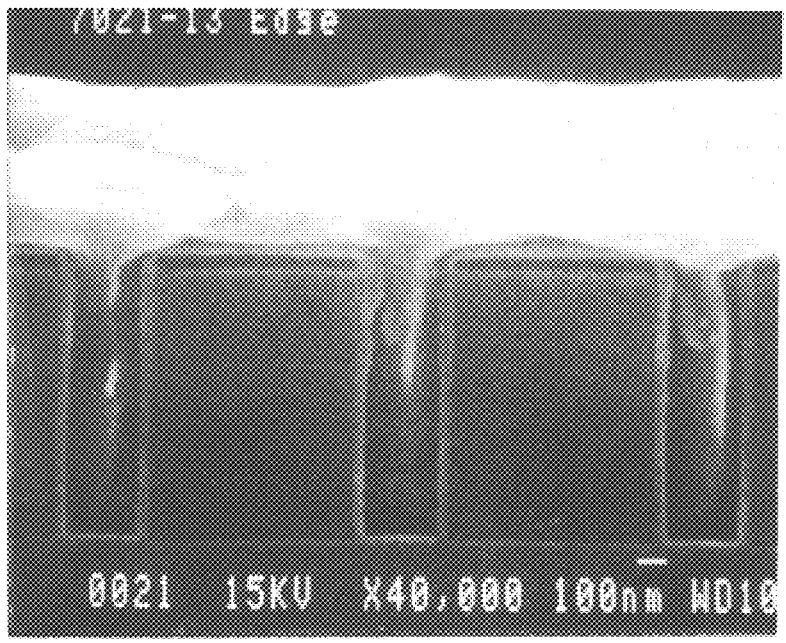

The elimination of these voids can be seen in FIGS. 3a–3c. FIG. 3a is an SEM image of a device fabricated using the method of the instant invention. Processing of the device in FIG. 3a has been completed up through step 104 of FIG. 1. The CVD Al line formed in step 104 is the white lining in the openings. FIG. 3b illustrates the device after step 108 of FIG. 1 has been performed. The voids (the spherical dark spots in the openings) formed during the filling of the opening can be seen in this figure. FIG. 3c illustrates the device after step 110 of FIG. 1 has been performed. As can be seen in FIG. 3c, the voids no longer appear in the contact/via/interconnect metal. Hence, provided that a thin, continuous CVD Al layer is deposited in step 104, the voids can be eliminated in step 110 assuming that a sufficiently high thermal step is performed in step 110. However, if the CVD Al layer is too thick, the top of the via will be bridged by the CVD Al and the void in the contact/via/interconnect will not be annealed away because of the pressure of the residual gases trapped from the CVD Al process. Alternately, if the CVD Al line is too thin, or the choice of nucleation layer results in discontinuous sidewall coverage, reflow is inhibited and a void forms at the sidewall of the via where the wetting layer is absent.

Figure 4:
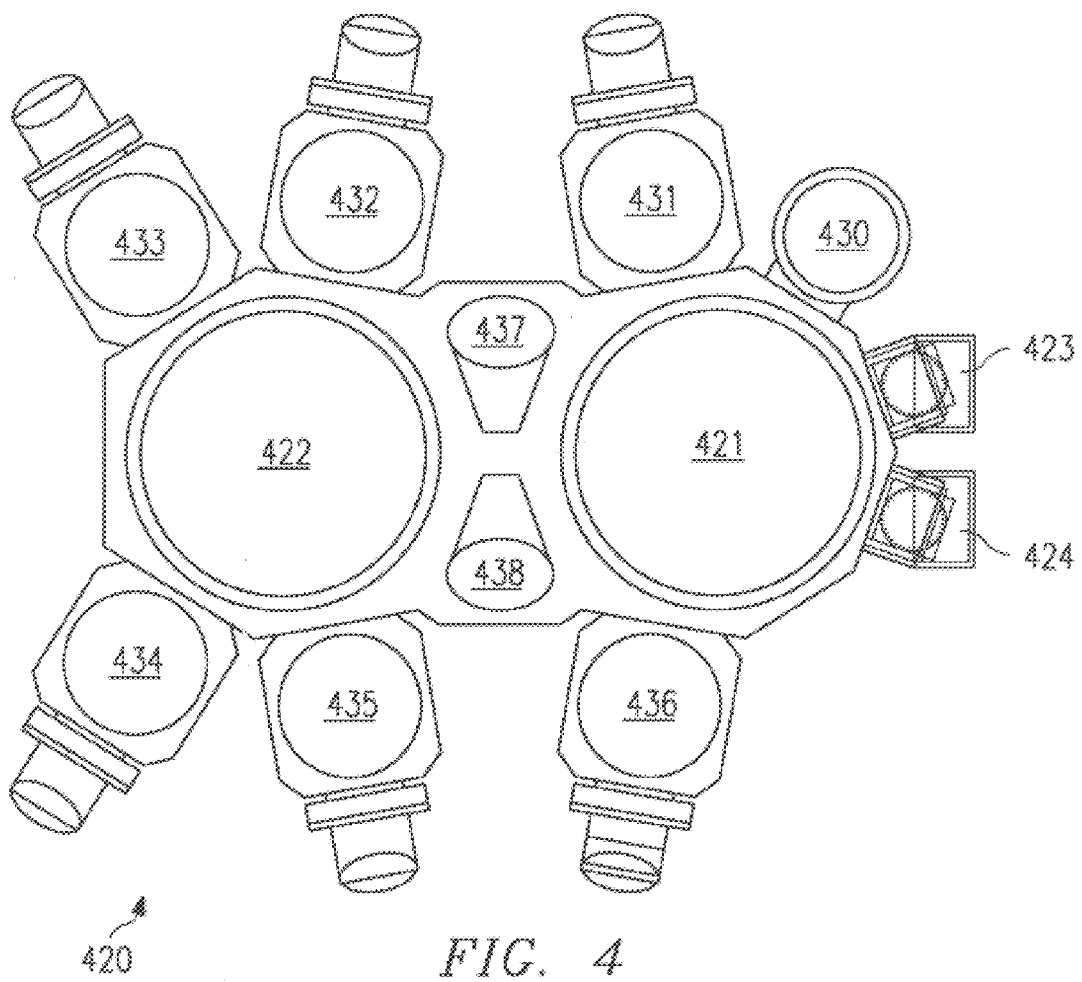
FIG. 4 illustrates processing equipment that can be utilized to perform the method of the instant invention.

FIG. 4 illustrates a processing chamber that may be used to process wafers using the method of the instant invention. Deposition system 420 is configured with a central mainframe (not shown), processing chambers 430–438, and a handlers 421 and 422, which are capable of conveying wafers between the processing chambers and pressure variable loadlocks 423 and 424. Loadlock 423 and 424 are operable to cycle between different levels of vacuum as cassettes are loaded and unloaded to atmosphere. Wafer handlers 421 and 422 include rotatable, extendible arms that are operable to transfer wafers from cassettes to process chambers and back to the cassettes as the wafers are processed by the system. An orient/degas station 430 is provided in order to properly center and orient the wafers for handling as well as heat the wafers in order to implement preliminary thermal processing and to assist in the outgassing of the wafers. The wafers can be transported by the handlers 421 and 422 to physical vapor deposition or chemical vapor deposition stations represented by chambers 431–436. Station 438 represents a sputter etch station that may be used to presputter the wafers before deposition. Station 437 represents a cooldown chamber that is used to cool the wafers before returning them to the cassettes. Stations 437 and 438 are commonly referred to as "passthru chambers" because wafers are handed off between the two handlers 421 and 422 through these chambers. The wafers can be transferred by the handlers to one or more of the following stations for application of the cavity fill materials in accordance with the present invention: sputter preclean chamber 438, chemical vapor deposition ("CVD") chamber 433 and 436, PVD deposition stations 431, 432, 434, and 435, and cooldown station 437. The modular design of this clustered deposition system allows for multiple combinations of different CVD and PVD stations which may be located at the different processing positions around the mainframe. In addition, the sputter etch station may be located at positions 431, 436 or 438. A monitor (not shown) can optionally be connected to various control apparatus to provide a display of the progress of wafers through system 420.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of fabricating a conductive structure for electrically connecting one portion of a semiconductor device to another portion of said device, said method comprising the steps of:
    providing a continuous liner layer of said semiconductor substrate, said liner layer comprised of CVD Al;
    forming a first conductor on said liner layer, said first conductor formed using a source whose output power is in the range of 1 to 5 kW; and
    forming a second conductor on said first conductor, said second conductor formed using a source whose output power is in the range of 10 to 20 kW.

2. The method of claim 1, wherein said conductive structure is selected from the group consisting of: contact, via, and trench.

3. The method of claim 1, wherein a nucleation layer is formed beneath said continuous liner layer.

4. The method of claim 3, wherein said nucleation layer is comprised of titanium.

5. The method of claim 3, wherein said nucleation layer is comprised of a Ti/TiN stack.

6. The method of claim 1, wherein said step of forming a first conductor on said liner layer is comprised of depositing an aluminum containing layer.

7. The method of claim 6, wherein said step of depositing an aluminum-containing layer is comprised of depositing an aluminum-containing layer using physical vapor deposition.

8. The method of claim 1, wherein said step of forming a second conductor on said first conductor is comprised of depositing an aluminum containing layer.

9. The method of claim 8, wherein said step of depositing an aluminum-containing layer is comprised of depositing an aluminum-containing layer using physical vapor deposition.

10. A method of fabricating an electrical device having an interconnect over a semiconductor substrate, said method comprising the steps of:

provding a dielectric layer, said dielectric layer having a opening with sidewalls and a bottom;

forming a liner on said sidewalls and bottom of said opening in said dielectric layer, said liner comprised of CVD Al;

forming a first conductive layer on said liner, said first conductor formed using low power deposition; and forming a second conductive layer on said first conductive layer, said second conductive layer formed using higher power deposition.

11. The method of claim 10, wherein said electrical device is selected from the group consisting of: a DRAM device, a logic device, a digital signal processor, a microprocessor, or any combination thereof.

12. The method of claim 10, wherein said dielectric layer is comprised of a material selected from the group consisting of: an aerogel, a zerogel, parylene, BPSG, PSG, HSG, an oxide, or any combination thereof.

13. The method of claim 10, further comprising the step of: forming a nucleation layer beneath said liner.

14. The method of claim 13, wherein said nucleation layer is a continuous metallic-containing material.

15. The method of claim 14, wherein said nucleation layer is comprised of a Ti/TN stack.

16. The method of claim 10, wherein said step of forming a first conductive layer is comprised of depositing an aluminum-containing material on said liner using physical vapor deposition.

17. The method of claim 16, wherein said low power deposition is PVD accomplished using a power source of around 1 to 5 kWatt.

18. The method of claim 16, wherein said aluminum-containing material is comprised of a material selected from the group consisting of: copper doped aluminum, Al—Ge—Cu, Al—Si—Cu.

19. The method of claim 10, wherein said step of forming said second conductive layer is comprised of depositing an aluminum-containing material on said first conductive layer using physical vapor deposition.

20. The method of claim 19, wherein said higher power deposition is PVD accomplished using a power source of around 10 to 20 kWatt.

21. The method of claim 19, wherein said aluminum-containing material is comprised of a material selected from the group consisting of: copper doped aluminum, Al—Ge—Cu, Al—Si—Cu.

* * * * *